United States Patent
Kim et al.

(10) Patent No.: US 10,607,667 B2
(45) Date of Patent: Mar. 31, 2020

(54) DATA OUTPUT CIRCUIT

(71) Applicant: SK hynix Inc., Gyeonggi-do (KR)

(72) Inventors: Hee Jun Kim, Gyeonggi-do (KR);
Minsoon Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/248,416

(22) Filed: Jan. 15, 2019

(65) Prior Publication Data

US 2019/0371372 A1    Dec. 5, 2019

(30) Foreign Application Priority Data

Jun. 1, 2018    (KR) .................. 10-2018-0063675

(51) Int. Cl.
*G11C 7/10* (2006.01)
*G11C 5/14* (2006.01)

(52) U.S. Cl.
CPC ............ *G11C 7/1051* (2013.01); *G11C 5/145* (2013.01); *G11C 5/147* (2013.01); *G11C 7/1048* (2013.01); *G11C 2207/2254* (2013.01)

(58) Field of Classification Search
None
See application file for complete search history.

(56) References Cited

U.S. PATENT DOCUMENTS 8,553,471 B2 * 10/2013 Kim .................. G11C 7/1057
365/189.05
9,041,436 B2 * 5/2015 Kuwahara .............. G11C 5/063
326/83
2008/0304336 A1 * 12/2008 Kim ...................... G11C 5/063
365/189.11
2010/0039873 A1 * 2/2010 Oh .......................... G11C 7/08
365/189.11

FOREIGN PATENT DOCUMENTS

KR    1020120040775    4/2012

OTHER PUBLICATIONS

Poulton, J. et al., A 14-mW 6.25-Gb/s Transceiver in 90-nm CMOS, IEEE Journal of Solid-State Circuits, Dec. 2007, pp. 2745-2757, vol. 42, No. 12.
Leibowitz, B. et al., a 4.3 GB/s Mobile Memory Interface With Power-Efficient Bandwidth Scaling, IEEE Journal of Solid-State Circuits, Apr. 2010, pp. 889-898, vol. 45, No. 4.

* cited by examiner

*Primary Examiner* — Tan T. Nguyen
(74) *Attorney, Agent, or Firm* — IP & T Group LLP

(57) ABSTRACT

A data output circuit includes: a voltage generation circuit configured to generate an operating voltage having a potential level higher than levels of a first power supply voltage and a second power supply voltage; a pre-driver circuit configured to generate pull-up code signals and pull-down code signals according to calibration code signals and the operating voltage; a data pre-driver circuit configured to generate and output internal data according to a data signal and the first power supply voltage; and a main driver circuit configured to generate output data according to the internal data and the second power supply voltage, wherein a driving strength of the main driver circuit is adjusted according to the pull-up code signals and the pull-down code signals.

17 Claims, 5 Drawing Sheets

DATA OUTPUT CIRCUIT

CROSS-REFERENCE TO RELATED APPLICATION

The present application claims priority under 35 U.S.C. § 119(a) to Korean patent application number 10-2018-0063675, filed on Jun. 1, 2018, which is incorporated herein by reference in its entirety.

BACKGROUND

Field of Invention

Various embodiments of the present disclosure generally relate to an electronic device. Particularly, the embodiments relate to a data output circuit of which driving strength is adjusted.

Description of Related Art

As the use of mobile information devices using memory systems as storage media, particularly, smartphones, tablet personal computers (PCs), and the like, are increasing, interest and importance in memory devices have been further increased.

As various applications appear in addition to parallelization using high-speed processors or multicores, demand levels for semiconductor memory systems have been continuously increasing in terms of not only performance but also reliability.

A memory system is a storage device implemented using a semiconductor such as silicon (Si), germanium (Ge), gallium arsenide (GaAs), or indium phosphide (InP). The storage or memory device may be generally classified as a volatile memory device or a nonvolatile memory device. In a volatile memory device, stored data is lost when the power supply is interrupted. Examples of a volatile memory device include a static random access memory (SRAM), a dynamic RAM (DRAM), a synchronous DRAM (SDRAM), and the like. In a nonvolatile memory device, stored data is retained even when the power supply is interrupted. Examples of a nonvolatile memory device include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. Flash memory is generally classified as a NOR type flash memory or a NAND type flash memory.

The memory system may include a memory device for storing data and a memory controller for controlling the memory device. Each of the memory device and the memory controller outputs internal data through a data pad, using a data output circuit, thereby performing a data transmission operation between the memory device and the memory controller.

SUMMARY

Embodiments provide a data output circuit driven with a driving strength set according to a ZQ calibration code value set in an operation of outputting data.

According to an aspect of the present disclosure, there is provided a data output circuit including: a voltage generation circuit configured to generate an operating voltage having a potential level higher than levels of a first power supply voltage and a second power supply voltage; a pre-driver circuit configured to generate pull-up code signals and pull-down code signals according to calibration code signals and the operating voltage; a data pre-driver circuit configured to generate and output internal data according to a data signal and the first power supply voltage; and a main driver circuit configured to generate output data according to the internal data and the second power supply voltage, wherein a driving strength of the main driver circuit is adjusted according to the pull-up code signals and the pull-down code signals.

According to another aspect of the present disclosure, there is provided a data output circuit including: a voltage generation circuit is configured to generate an operating voltage having a level higher than that of a power supply voltage; a pre-driver circuit configured to generate pull-up code signals and pull-down code signals according to the operating voltage, wherein the pull-up code signals and the pull-down code signals are generated to have a level of a ground voltage or a level of the operating voltage; and a main driver circuit configured to generate output data corresponding to the level of the power supply voltage or the level of the ground voltage according to internal data, wherein a driving strength of the main driver circuit is adjusted according to the pull-up code signals and the pull-down code signals.

According to an aspect of the present disclosure, there is provided a data output circuit including: a voltage generation circuit operably coupled to a first power supply voltage and configured to generate an operating voltage having a level higher than a level of the first power supply voltage; a calibration code generation circuit configured to generate calibration code signals based on a temperature change and a fixed power supply voltage; a pre-driver circuit configured to receive the operating voltage and generate pull-up code signals and pull-down code signals based on the calibration code signals; a data pre-driver circuit operably coupled to the first power supply voltage and configured to receive and invert input data and output the inverted input data as internal data; and a main driver circuit operably coupled to a second power supply voltage less than the operating voltage and configured to receive the internal data and generate output data, wherein a level of the output data is adjusted according to the pull-up code signals or the pull-down code signals.

BRIEF DESCRIPTION OF THE DRAWINGS

Various embodiments will now be described in more detail with reference to the accompanying drawings; however, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. Also, throughout the specification, reference to "an embodiment" or the like is not necessarily to only one embodiment, and different references to any such phrase are not necessarily to the same embodiment(s).

In the drawings, dimensions of the figures may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
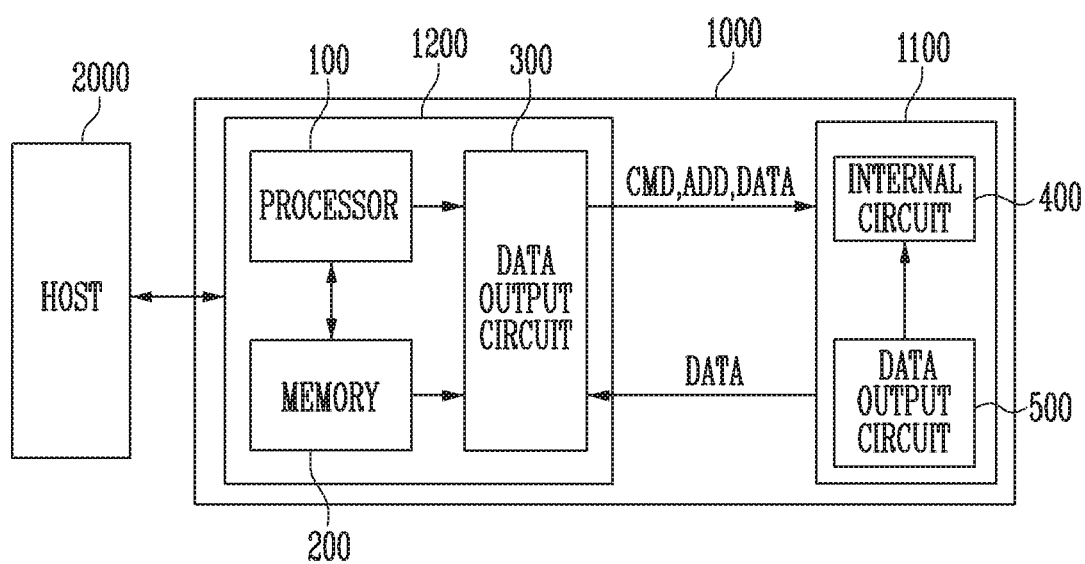
FIG. 1 is a diagram illustrating a memory system according to an embodiment of the present disclosure.

The specific structural and functional description herein is for the purpose of describing various embodiments of the present invention. Aspects of the present invention, however, can be implemented in various other forms as will be apparent to those skilled in the art in light of the present disclosure. Thus, the present invention is not limited to the embodiments set forth herein.

The disclosed embodiments are described and illustrated in detail. However, neither these embodiments nor the present invention in general are limited to the specific details disclosed. Rather, the present invention is intended to include all changes, equivalents, or substitutes that do not depart from the spirit and technical scope of the present disclosure.

While terms such as "first" and "second" may be used to identify various components, such components are not limited to the above terms. The above terms are used only to distinguish one component from another that otherwise have the same or similar names. For example, a first component in one instance may be referred to as a second component in another instance and vice versa without limiting the scope of rights of the present disclosure.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms and vice versa, unless the context clearly indicates otherwise. It will be further understood that terms such as "including" or "having," as well as other open ended terms, are intended to indicate the existence of stated features, numbers, operations, actions, components, parts, or combinations thereof but are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description of techniques that are well known in the applicable and not directly related to the present disclosure is omitted. Thus, the present invention is not unnecessarily obscured.

Various embodiments of the present disclosure will be described in detail with reference to the accompanying drawings in order for those skilled in the art to be able to readily practice the present invention.

FIG. 1 is a diagram illustrating a memory system 1000 according to an embodiment of the present disclosure.

Referring to FIG. 1, the memory system 1000 may include a memory device 1100 for storing data and a memory controller 1200 for controlling the memory device 1100 under the control of a host 2000.

The host 2000 may communicate with the memory system 1000 by using an interface protocol such as peripheral component interconnect express (PCI-e or PCIe), advanced technology attachment (ATA), serial ATA (SATA), parallel ATA (PATA), or serial attached SCSI (SAS). Interface protocols between the host 2000 and the memory system 1000 are not limited to the above-described examples; any one of interface protocols such as a universal serial bus (USB), a multi-media card (MMC), an enhanced small disk interface (ESDI), and integrated drive electronics (IDE) may also be used.

The memory device 1100 operates under the control of the memory controller 1200. In an embodiment, the memory device 1100 may be a flash memory device. The memory device 1100 may include a memory cell array having a plurality of memory blocks.

The memory device 1100 receives a command CMD and an address ADD from the memory controller 1200 through a channel, and accesses an area of the memory cell array, which is selected by the address ADD. That is, the memory device 1100 performs an internal operation corresponding to the command CMD on the area selected by the address ADD. For example, the memory device 1100 performs a program operation on a selected memory block in response to a command CMD, an address ADD, and data DATA, which correspond to the program operation. Also, the memory device 1100 performs a read operation on the selected memory block in response to a command CMD and an address ADD, which correspond to the read operation, and read data DATA may be output to the memory controller 1200.

In an embodiment, the memory device 1100 may include an internal circuit 400 and a data output circuit 500. The internal circuit 400 performs a program operation on a selected memory block in response to a command CMD, an address ADD, and data DATA in the program operation. Also, the internal circuit 400 performs a read operation on the selected memory block in response to a command CMD and an address ADD in the read operation. The data output circuit 500 may receive data read by the internal circuit 400 in the read operation and output the received data to the memory controller 1200.

The memory controller 1200 may control overall operations of the memory system 1000, and control data exchange between the host 2000 and the memory device 1100. For example, the memory controller 1200 may control the memory device 1100 in response to a request from the host 2000 to program data, read data, or erase programmed data.

For example, the memory controller 1200 may output a command CMD, an address ADD, and data DATA, which correspond to each of the overall operations, in response to a request from the host 2000. The memory controller 1200 may receive data DATA and output the received data DATA to the host 2000.

The memory controller 1200 may include a processor 100, a memory 200, and a data output circuit 300.

The processor 100 controls a read operation, a program operation, an erase operation, and a background operation of the memory device 1100. The processor 100 drives firmware for controlling the memory device 1100.

When a request is received from the host 2000, the processor 100 generates a command corresponding to the request received from the host 2000, and generates an address by translating a logical block address received from the host 2000 into a physical black address. In an embodiment, the processor 100 performs a function of a flash translation layer (FTL).

The memory 200 operates under the control of the processor 100. The memory 200 may be used as a working memory, cache memory or buffer memory of the processor 100. The memory 200 may store program codes and commands, which are executed by the processor 100. The memory 200 may store data processed by the processor 100. The memory 200 may be a static RAM (SRAM) or a dynamic RAM (DRAM).

The data output circuit 300 receives a command and an address, which are generated by the processor 100, and data output from the memory 200. Further, the data output circuit 300 outputs a command CMD, an address ADD, and data DATA by converting signal levels of the received command, address, and data into those suitable for the memory device 1100.

By way of example, a case where the memory controller 1200 includes the data output circuit 300 for outputting the command CMD, the address ADD, and the data DATA to the memory device 1100 is illustrated and described. However, the present disclosure is not limited to that arrangement. The memory controller 1200 may further include a data output circuit for outputting data received from the memory device 1100 to the host 2000.

Figure 2:
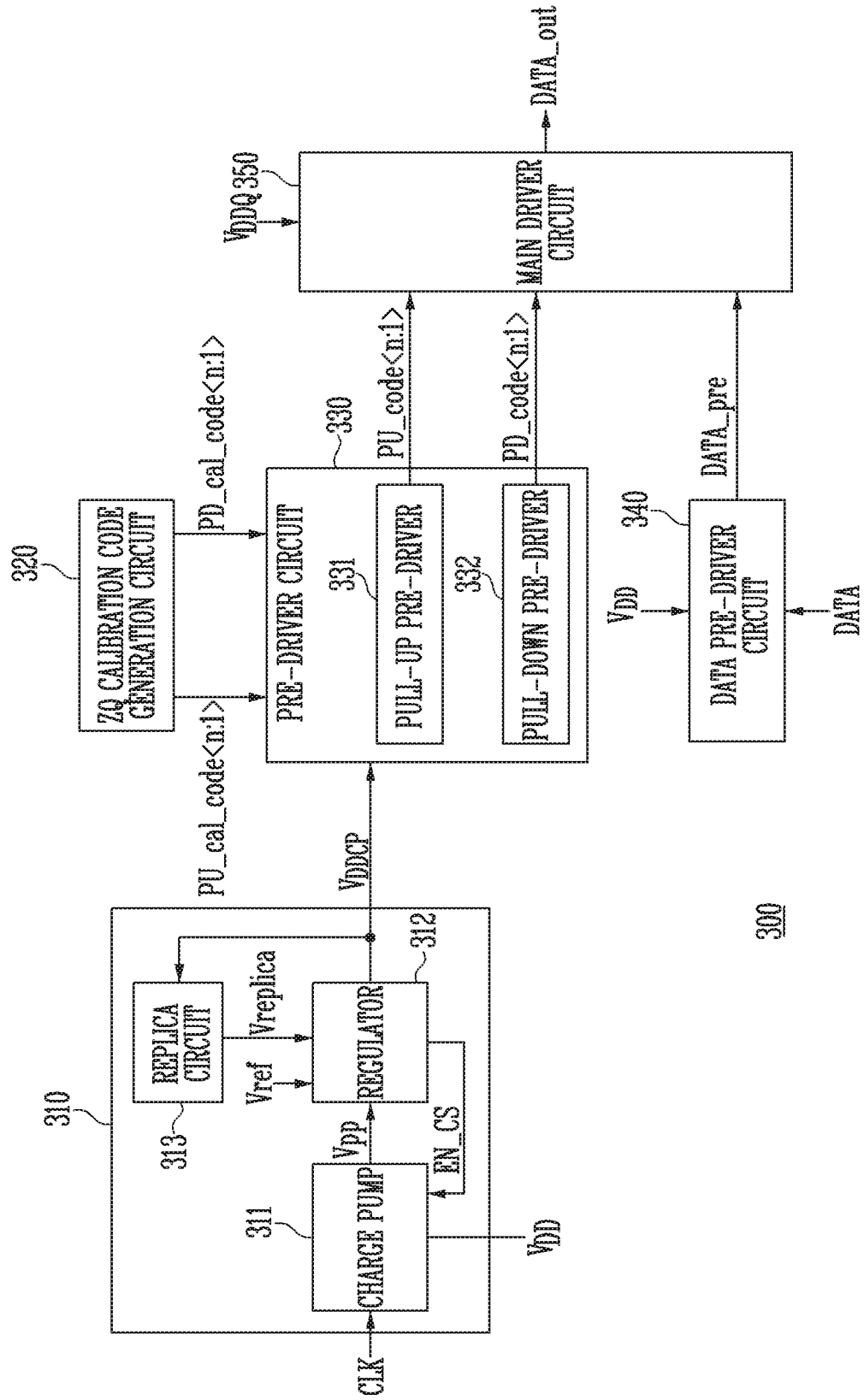
FIG. 2 is a block diagram illustrating a data output circuit according to an embodiment of the present disclosure.

FIG. 2 is a block diagram illustrating a data output circuit according to an embodiment of the present disclosure, for example, the data output circuit 300 of FIG. 1.

Configurations and operations of the data output circuit 300 in the memory controller 1200 of FIG. 1 and the data output circuit 500 in the memory device 1100 of FIG. 1 are similar. Therefore, the data output circuit 300 will be described in detail as an example.

Referring to FIG. 2, the data output circuit 300 may include a voltage generation circuit 310, a ZQ calibration code generation circuit 320, a pre-driver circuit 330, a data pre-driver circuit 340, and a main driver circuit 350.

The voltage generation circuit 310 generates and outputs an operating voltage $V_{DDCP}$ regulated to have a constant level in response to a first power supply voltage $V_{DD}$ and a clock signal CLK. The voltage generation circuit 310 generates and outputs the operating voltage $V_{DDCP}$ having a constant potential level regardless of the potential level of the first power supply voltage $V_{DD}$, which may change as a result of an external environmental change. The operating voltage $V_{DDCP}$ may be adjusted according to the potential of output data DATA_out output from the main driver circuit 350, that is, whether the potential of DATA_out corresponds to a first or high logic level.

The voltage generation circuit 310 includes a charge pump 311 for generating a high voltage $V_{PP}$, a regulator 312 for outputting the operating voltage $V_{DDCP}$ by regulating the high voltage $V_{PP}$, and a replica circuit 313 for outputting a replica voltage Vreplica having a potential level corresponding to the first logic level of the output data DATA_out output from the main driver circuit 350.

The charge pump 311 generates and outputs the high voltage $V_{PP}$ by performing a pumping operation using the first power supply voltage $V_{DD}$ in response to the clock signal CLK having a constant period.

The regulator 312 receives the high voltage $V_{PP}$ from the charge pump 311, and generates and outputs an enable control signal EN_CS by comparing the replica voltage Vreplica with a reference voltage Vref. The charge pump 311 may perform a pumping operation or stop a pumping operation being performed in response to the enable control signal EN_CS. That is, the regulator 312 generates an enable control signal EN_CS for controlling a pumping operation by comparing the replica voltage Vreplica received from the replica circuit 313 with the reference voltage Vref, and adjusts and outputs the operating voltage $V_{DDCP}$ at a specific level, by performing a pumping operation or stopping a pumping operation being performed in response to the enable control signal EN_CS. The operating voltage $V_{DDCP}$ may preferably have a potential level higher than that of the first power supply voltage $V_{DD}$.

For example, when the potential level of the replica voltage Vreplica is higher than that of the reference voltage Vref, the regulator 312 may decrease the potential level of the operating voltage $V_{DDCP}$ by inactivating the enable control signal EN_CS and stopping the pumping operation of the charge pump 311. When the potential level of the replica voltage Vreplica is less than that of the reference voltage Vref, the regulator 312 may increase the potential level of the operating voltage $V_{DDCP}$ by activating the enable control signal EN_CS and performing the pumping operation of the charge pump 311.

The replica circuit 313 may be configured the same as the pre-driver circuit 330 and the main driver circuit 350. In other words, the replica circuit 313 preferably includes components designed to have the same circuit structure as the pre-driver circuit 330 and the main driver circuit 350. The replica circuit 313 may be designed to generate and output the replica voltage Vreplica having a potential level corresponding to the first logic level of the output data DATA_out output from the main driver circuit 350. Therefore, the voltage generation circuit 310 may generate and output the operating voltage $V_{DDCP}$ of which potential level is adjusted according to the first logic level of the output data DATA_out output from the main driver circuit 350.

Alternatively, the replica circuit 313 may be included in the regulator 312.

The ZQ calibration code generation circuit 320 may detect a change in temperature and a change in power supply voltage. Then, the ZQ calibration code generation circuit 320 may generate and output pull-up calibration code signals PU_cal_code<n:1> and pull-down calibration code signals PD_cal_code<n:1>, which correspond to the detected changes. For example, the ZQ calibration code generation circuit 320 may generate pull-up calibration code signals PU_cal_code<n:1> and pull-down calibration code signals PD_cal_code<n:1>, which code values are changed depending on a difference value between a detected temperature and a reference temperature and/or a difference value between a level of a detected power supply voltage and a reference level.

The pre-driver circuit 330 generates and outputs pull-up code signals PU_code<n:1> and pull-down code signals PD_code<n:1> in response to the pull-up calibration code signals PU_cal_code<n:1> and the pull-down calibration code signals PD_cal_code<n:1>, respectively. The pre-driver circuit 330 changes a potential level of the pull-up code signals PU_code<n:1> and the pull-down code signals PD_code<n:1> to correspond to the level of the operating voltage $V_{DDCP}$ according to the operating voltage $V_{DDCP}$ output from the voltage generation circuit 310. Then, the pre-driver circuit 330 outputs the changed pull-up code signals PU_code<n:1> and the pull-down code signals PD_code<n:1>. For example, the pre-driver circuit 330 increases the level of the pull-up code signals PU_code<n:1> and the pull-down code signals PD_code<n:1> to correspond to the level of the operating voltage $V_{DDCP}$, and outputs the increased pull-up code signals PU_code<n:1> and the pull-down code signals PD_code<n:1>.

The pre-driver circuit 330 may include a pull-up pre-driver 331 and a pull-down pre-driver 332. The pull-up pre-driver 331 generates and outputs pull-up code signals PU_code<n:1> having the level of the operating voltage $V_{DDCP}$ and the level of a ground voltage in response to the pull-up calibration code signals PU_cal_code<n:1>. The pull-down pre-driver 332 generates and outputs pull-down code signals PD_code<n:1> having the level of the operating voltage $V_{DDCP}$ and the level of the ground voltage in response to the pull-down calibration code signals PD_cal_code<n:1>.

The data pre-driver circuit 340 inverts a signal or data DATA to be output and outputs the inverted signal or data DATA as internal data DATA_pre. Further, the data pre-driver circuit 340 controls and outputs signals having a logic high level among the internal data DATA_pre to correspond to the level of the first power supply voltage $V_{DD}$.

The main driver circuit 350 generates and outputs output data DATA_out in response to the internal data DATA_pre. Further, the main driver circuit 350 adjusts the driving strength of a data output operation in response to the pull-up code signals PU_code<n:1> and the pull-down code signals PD_code<n:1>. The main driver circuit 350 is preferably driven by being supplied with a second internal power supply voltage $V_{DDQ}$.

As described above, the data output circuit according to an embodiment of the present disclosure generates the operating voltage $V_{DDCP}$ using the voltage generation circuit 310, and generates the pull-up code signals PU_code<n:1> and the pull-down code signals PD_code<n:1>, using the operating voltage $V_{DDCP}$. The potential level of the operating voltage $V_{DDCP}$ is adjusted to correspond to the first, e.g., high, logic level of the output data DATA_out, which is output from the main driver circuit 350. Thus, a signal having a high level among the pull-up code signals PU_code<n:1> and the pull-down code signals PD_code<n:1> has the same potential level as the operating voltage $V_{DDCP}$ regardless of a change in power supply voltage. Therefore, the ZQ calibration code generation circuit 320 may skip an operation of detecting a change in power supply voltage and calibrating the detected voltage change, and generate the pull-up calibration code signals PU_cal_code<n:1> and pull-down calibration code signals PD_cal_code<n:1>, using a code value fixed to a certain value and a code value corresponding to a change in temperature. Accordingly, the operation speed of the data output circuit 300 may be improved.

Figure 3:
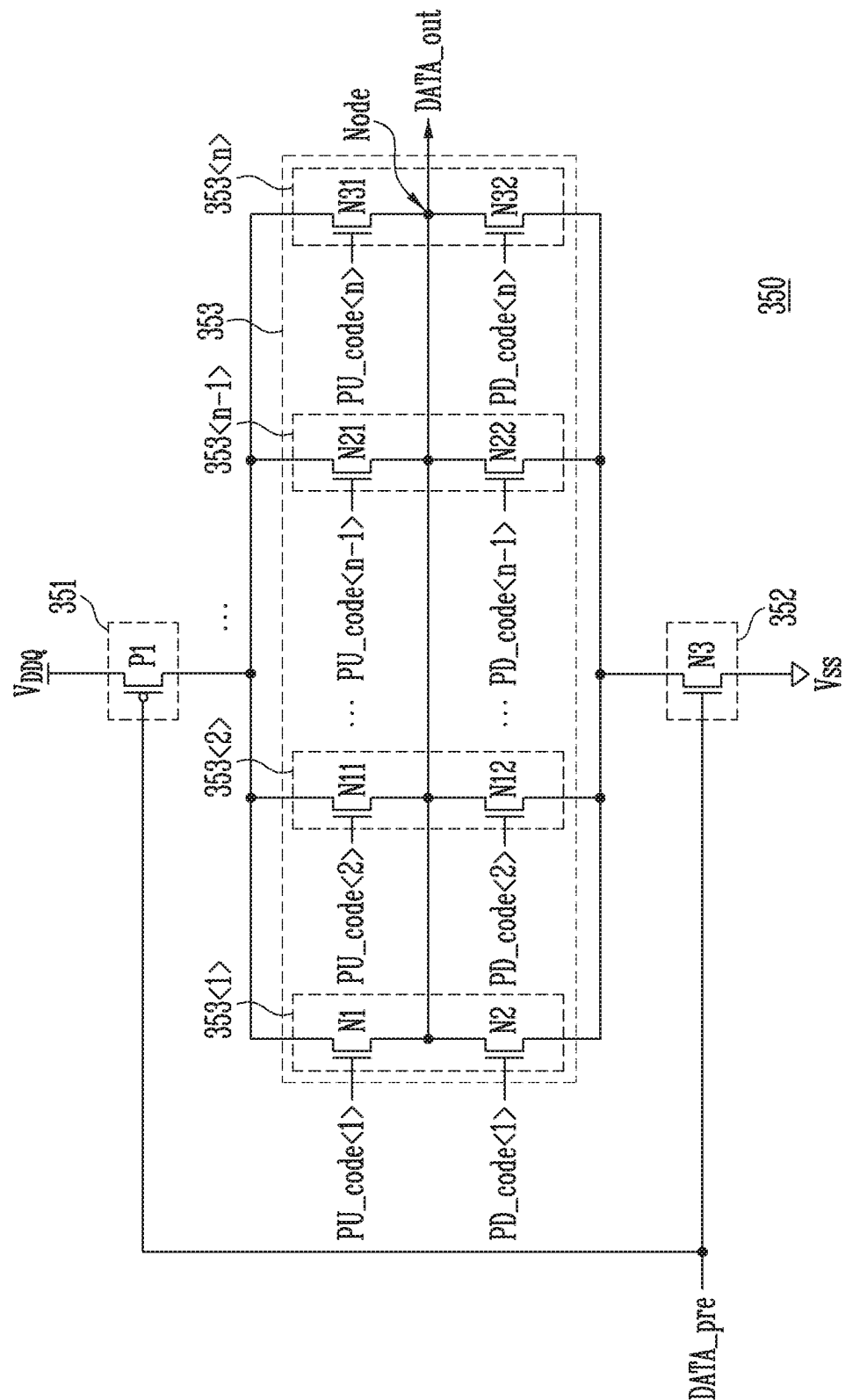
FIG. 3 is a circuit diagram illustrating a main driver circuit according to an embodiment of the present disclosure.

FIG. 3 is a circuit diagram illustrating a main driver circuit according to an embodiment of the present disclosure, for example, the main driver circuit 350 of FIG. 2.

Referring to FIG. 3, the main driver circuit 350 includes a pull-up circuit 351, a pull-down circuit 352, and a trimming circuit 353.

The pull-up circuit 351 is coupled between a terminal to which a second power supply voltage $V_{DDQ}$ is applied and the trimming circuit 353. The pull-up circuit 351 applies the second power supply voltage $V_{DDQ}$ to the trimming circuit 353 in response to the internal data DATA_pre. The internal data DATA_pre may be received from the data pre-driver circuit 340 of FIG. 2. The pull-up circuit 351 may be configured with a PMOS transistor.

The pull-down circuit 352 is coupled between the trimming circuit 353 and a terminal to which a ground voltage Vss is applied. The pull-down circuit 352 applies the ground voltage Vss to the trimming circuit 353 in response to the internal data DATA_pre. The pull-down circuit 352 may be configured with an NMOS transistor.

The trimming circuit 353 includes a plurality of trimming units 353<1> to 353<n>. The plurality of trimming units 353<1> to 353<n> may be commonly coupled to an output node Node.

Each of the plurality of trimming units 353<1> to 353<n> is activated or inactivated in response to a corresponding one of the pull-up code signals PU_code<n:1> or pull-down code signals PD_code<n:1> to adjust the driving strength of a data output operation.

Structures of the plurality of trimming units 353<1> to 353<n> are similar to one another, and therefore, a trimming unit 353<1> will be described as an example.

The trimming unit 353<1> includes an NMOS transistor N1 and an NMOS transistor N2, which are coupled in series between the pull-up circuit 351 and the pull-down circuit 352.

A node between the NMOS transistor N1 and the NMOS transistor N2 is coupled to the output node Node.

The NMOS transistor N1 is turned on or turned off in response to a pull-up code signal PU_code<1>, to apply the second power supply voltage $V_{DDQ}$ applied through the pull-up circuit 351 to the output node Node or interrupt the application of the second power supply voltage $V_{DDQ}$ to the output node Node.

The NMOS transistor N2 is turned on or turned off in response to a pull-down code signal PD_code<1>, to apply the ground voltage Vss applied through the pull-down circuit 352 to the output node Node or interrupt the application of the ground voltage Vss to the output node Node.

For example, the main driver circuit 350 applies the second power supply voltage $V_{DDQ}$ to the output node Node in response to the internal data DATA_pre having a logic low level (i.e., corresponding to the level of the ground voltage Vss) and the pull-up code signal PU_code<1> having a logic high level (i.e., corresponding to the level of the operating voltage $V_{DDCP}$). Further, the main driver circuit 350 interrupts the application of the second power supply voltage $V_{DDQ}$ to the output node Node in response to the internal data DATA_pre having a logic high level (i.e., corresponding to the level of the first power supply voltage $V_{DD}$) or the pull-up code signal PU_code<1> having the logic low level (i.e., corresponding to the level of the ground voltage Vss). The potential level of the pull-up code signal PU_code<1> having the logic high level may correspond to the level of the operating voltage $V_{DDCP}$, and preferably the potential level of the operating voltage $V_{DDCP}$ is higher than that of the second power supply voltage $V_{DDQ}$.

In an embodiment of the present disclosure, a transistor that is turned on or turned off in response to the pull-up code signal PU_code<1> may be configured as the NMOS transistor N1. The NMOS transistor may be designed to have a small size as compared with the PMOS transistor having the same current transmission ability.

For example, the main driver circuit 350 applies the ground voltage Vss to the output node Node in response to the internal data DATA_pre having the logic high level (i.e., corresponding to the level of the first power supply voltage $V_{DD}$) and the pull-down code signal PD_code<1> having the logic high level (i.e., corresponding to the level of the operating voltage $V_{DDCP}$). The main driver circuit 350 interrupts the application of the ground voltage Vss to the output node Node in response to the internal data DATA_pre having the logic low level (i.e., corresponding to the level of the ground voltage Vss) or the pull-down code signal PD_code<1> having the logic low level (i.e., corresponding to the level of the ground voltage Vss).

In the main driver circuit 350, when the number of signals applied with the logic high level among the pull-up code signals PU_code<n:1> and the pull-down code signals PD_code<n:1> increases, the number of activated trimming units among the plurality of trimming units 353<1> to 353<n> increases, and thus the driving strength of the data output operation increases. When the number of signals applied with the logic high level among the pull-up code signals PU_code<n:1> and the pull-down code signals PD_code<n:1> decreases, the number of activated trimming units among the plurality of trimming units 353<1> to 353<n> decreases, and thus the driving strength of the data output operation decreases.

An operation of the data output circuit 300 will be described as follows with reference to FIGS. 2 and 3.

The voltage generation circuit 310 generates and outputs an operating voltage $V_{DDCP}$ regulated to maintain a constant level in response to the first power supply voltage $V_{DD}$ and the clock signal CLK. The ZQ calibration code generation circuit 320 detects a change in temperature and/or a change in power supply voltage. The ZQ calibration code generation circuit 320 generates and outputs pull-up calibration code signals PU_cal_code<n:1> and pull-down calibration code signals PD_cal_code<n:1>, which correspond to the detected changes. The ZQ calibration code generation circuit 320 may skip a calibration operation corresponding to the change in power supply voltage, and generate the pull-up calibration code signals PU_cal_code<n:1> and the pull-down calibration code signals PD_cal_code<n:1>, using a code value fixed to a certain value and a code value corresponding to the change in temperature. The pre-driver circuit 330 generates and outputs pull-up code signals PU_code<n:1> and pull-down code signals PD_code<n:1> in response to the pull-up calibration code signals PU_cal_code<n:1> and the pull-down calibration code signals PD_cal_code<n:1>. The pre-driver circuit 330 changes a potential level of the pull-up code signals PU_code<n:1> and the pull-down code signals PD_code<n:1> to the level of the operating voltage $V_{DDCP}$ according to the operating voltage $V_{DDCP}$ output from the voltage generation circuit 310. The pre-driver circuit 330 outputs the changed pull-up code signals PU_code<n:1> and the changed pull-down code signals PD_code<n:1>. The pull-up pre-driver 331 generates and outputs pull-up code signals PU_code<n:1> having the level of the operating voltage $V_{DDCP}$ and the level of a ground voltage in response to the pull-up calibration code signals PU_cal_code<n:1>. The pull-down pre-driver 332 generates and outputs pull-down code signals PD_code<n:1> corresponding to the level of the operating voltage $V_{DDCP}$ and the level of the ground voltage in response to the pull-down calibration code signals PD_cal_code<n:1>. The data pre-driver circuit 340 inverts a signal or data DATA to be output and outputs the inverted signal or data DATA as internal data DATA_pre. For example, when the data DATA has the logic high level, the data pre-driver circuit 340 generates and outputs the internal data DATA_pre having the logic low level. When the data DATA has the logic low level, the data pre-driver circuit 340 generates and outputs the internal data DATA_pre having the logic high level. The main driver circuit 350 generates and outputs output data DATA_out in response to the internal data DATA_pre, and adjusts the driving strength of a data output operation in response to the pull-up code signals PU_code<n:1> and the pull-down code signals PD_code<n:1>.

As described above, according to an embodiment of the present disclosure, the pre-driver circuit 330 generates pull-up code signals and pull-down code signals using the operating voltage $V_{DDCP}$ generated to have a constant potential level that is higher than the level of the first power supply voltage $V_{DD}$. Thus, a ZQ calibration operation corresponding to a change in power supply voltage may be skipped. Further, since the potential level of the pull-up code signal is higher than the level of the second power supply voltage $V_{DDQ}$, the trimming circuit of the main driver circuit 350 is implemented with the NMOS transistor, so that the trimming circuit of the main driver circuit 350 may be designed to have a small size.

An arrangement where the data output circuit is included in the memory controller and the memory device has been described as an example. However, the present disclosure is not limited to that arrangement; the data output circuit may be included in electronic devices for outputting data or signals.

Figure 4:
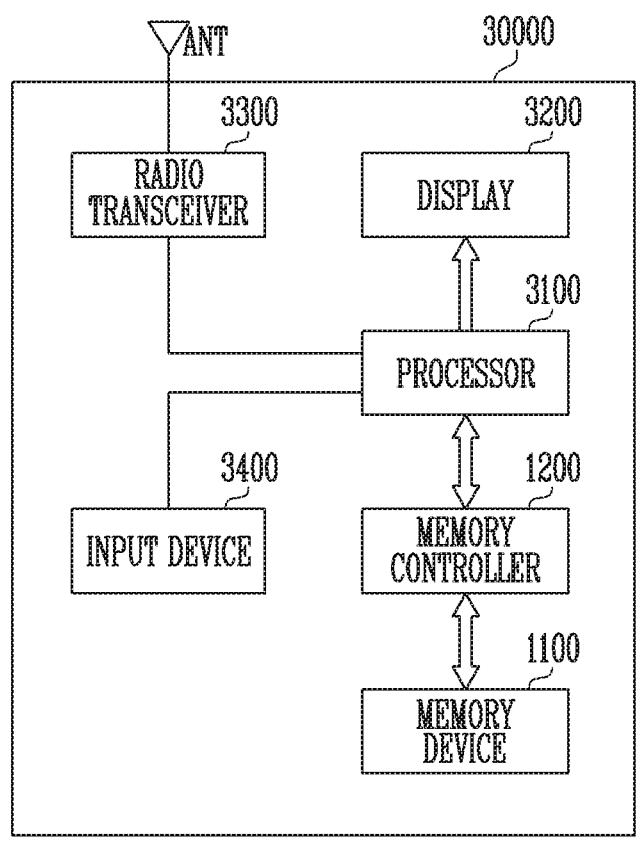
FIG. 4 is a diagram illustrating a memory system according to an embodiment of the present disclosure.

FIG. 4 is a diagram illustrating a memory system 30000 according to an embodiment of the present disclosure.

Referring to FIG. 4, the memory system 30000 may be implemented as a cellular phone, a smart phone, a tablet personal computer (PC), a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit and/or receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may convert a signal output from the processor 3100 into a radio signal, and output the converted radio signal to an external device through the antenna ANT. An input device 3400 is capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100. Also, the memory controller 1200 may be implemented with the memory controller shown in FIG. 1, and the memory device 1100 may be implemented with the memory device shown in FIG. 1.

Figure 5:
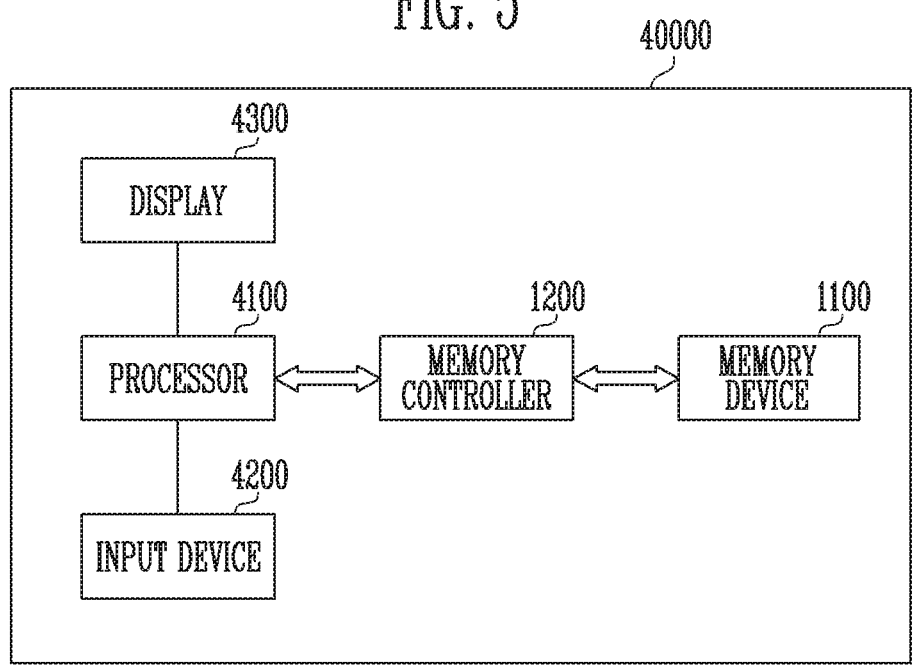
FIG. 5 is a diagram illustrating a memory system according to an embodiment of the present disclosure.

FIG. 5 is a diagram illustrating a memory system 40000 according to an embodiment of the present disclosure.

Referring to FIG. 5, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100. Also, the memory controller 1200 may be implemented with the memory controller shown in FIG. 1, and the memory device 1100 may be implemented with the memory device shown in FIG. 1.

Figure 6:
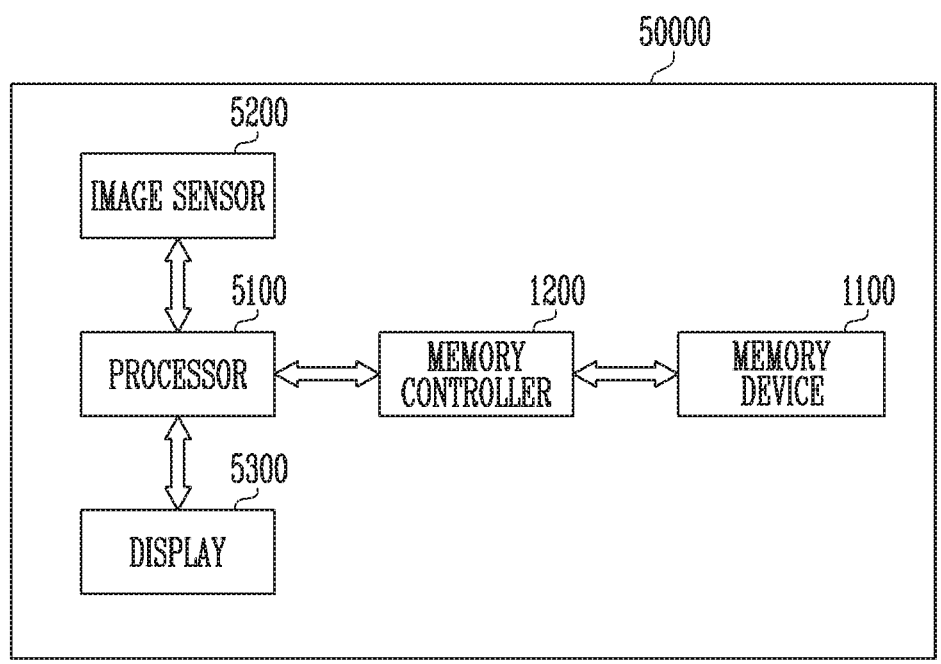
FIG. 6 is a diagram illustrating a memory system according to an embodiment of the present disclosure.

FIG. 6 is a diagram illustrating a memory system 50000 according to an embodiment of the present disclosure.

Referring to FIG. 6, the memory system 50000 may be implemented as an image processing device, e.g., a digital camera, a mobile terminal having a digital camera attached thereto, a smart phone having a digital camera attached thereto, or a tablet personal computer (PC) having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100. Also, the memory controller 1200 may be implemented with the memory controller shown in FIG. 1, and the memory device 1100 may be implemented with the memory device shown in FIG. 1.

Figure 7:
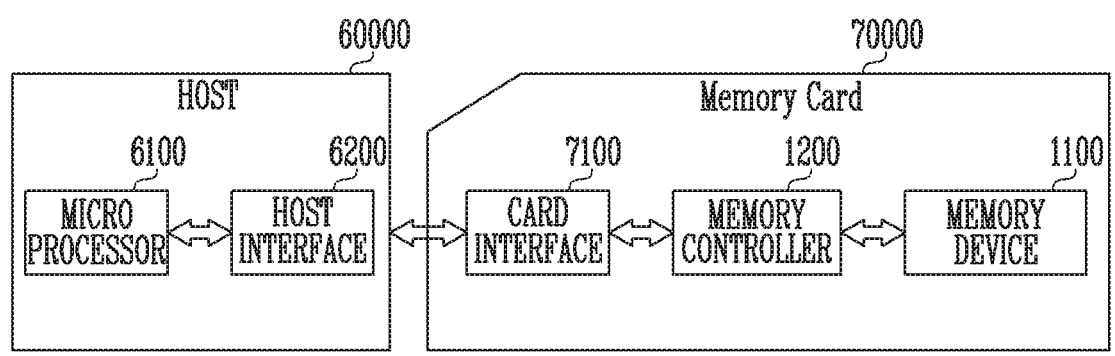
FIG. 7 is a diagram illustrating a memory system according to an embodiment of the present disclosure.

FIG. 7 is a diagram illustrating a memory system 70000 according to an embodiment of the present disclosure.

Referring to FIG. 7, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may be hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100. In addition, the memory controller 1200 may be implemented with the memory controller shown in FIG. 1, and the memory device 1100 may be implemented with the memory device shown in FIG. 1.

According to embodiments of the present disclosure, no separate calibration time is required by the data output circuit that is driven with a driving strength set according to a ZQ calibration code value set in an operation of outputting data. Thus, the operation speed of the data output circuit may be improved.

While the present disclosure has been shown and described with reference to certain embodiments thereof, it will be understood by those skilled in the art that various changes in form and details may be made without departing from the spirit and scope of the present disclosure as defined by the appended claims and their equivalents. Therefore, the scope of the present disclosure should not be limited to the above-described embodiments but should be determined by the appended claims and equivalents thereof.

In the above-described embodiments, all steps may be selectively performed or part of the steps and may be omitted. In each embodiment, the steps are not necessarily performed in the described order and instead may be rearranged. The disclosed embodiments are provided to facilitate an understanding of the present disclosure, not limit the scope of the present disclosure. As will be apparent to those skilled in the art in light of the present disclosure, various modifications can be made.

Although specific terminologies are used herein, they are only to explain embodiments of the present disclosure. However, the present disclosure is not restricted by such terminologies. It should be apparent to those skilled in the art that various modifications can be made and all such modifications are encompassed by the present invention to the extent they fall within the scope of the claims.

What is claimed is:

1. A data output circuit comprising:
   a voltage generation circuit configured to generate an operating voltage having a potential level higher than levels of a first power supply voltage and a second power supply voltage;
   a pre-driver circuit configured to generate pull-up code signals and pull-down code signals according to calibration code signals and the operating voltage;
   a data pre-driver circuit configured to generate and output internal data according to a data signal and the first power supply voltage; and
   a main driver circuit configured to generate output data according to the internal data and the second power supply voltage, wherein a driving strength of the main driver circuit is adjusted according to the pull-up code signals and the pull-down code signals.

2. The data output circuit of claim 1, wherein the voltage generation circuit includes:
   a charge pump configured to generate a high voltage by performing a pumping operation in response to the first power supply voltage, a clock signal, and an enable control signal;
   a replica circuit configured to generate a replica voltage having a potential level corresponding to a first logic level of the output data output from the main driver circuit; and
   a regulator configured to generate the enable control signal for controlling the pumping operation of the charge pump in response to the replica voltage and a reference voltage, and output the operating voltage by adjusting a potential level of a high voltage.

3. The data output circuit of claim 1, further comprising a ZQ calibration code generation circuit configured to generate the calibration code signals,
   wherein the ZQ calibration code generation circuit generates the calibration code signals according to a first calibration code value corresponding to a change in temperature and a second calibration code value corresponding to a change in power supply voltage.

4. The data output circuit of claim 3, wherein the ZQ calibration code generation circuit skips an operation of detecting the change in power supply voltage and calibrating the detected change, and uses the second calibration code value fixed to a certain value.

5. The data output circuit of claim 1, wherein the pre-driver circuit includes:
   a pull-up pre-driver configured to generate the pull-up code signals according to the calibration code signals; and
   a pull-down pre-driver configured to generate the pull-down code signals according to the calibration code signals,
   wherein the pull-up pre-driver and the pull-down pre-driver increase levels of signals having a logic high level among the pull-up code signals and the pull-down code signals to the level of the operating voltage, using the operating voltage, and outputs the signals.

6. The data output circuit of claim 1, wherein the main driver circuit includes a pull-up circuit, a trimming circuit, and a pull-down circuit, which are coupled in series between a terminal to which the second power supply voltage is applied and a terminal to which a ground voltage is applied,
   wherein the pull-up circuit applies the second power supply voltage to the trimming circuit in response to the internal data, and
   wherein the pull-down circuit applies the ground voltage to the trimming circuit in response to the internal data.

7. The data output circuit of claim 6, wherein the pull-up circuit includes a PMOS transistor, and the pull-down circuit includes an NMOS transistor.

8. The data output circuit of claim 6, wherein the trimming circuit includes a plurality of trimming units commonly coupled to an output node,
   wherein each of the plurality of trimming units is activated or inactivated in response to one of the pull-up or pull-down code signals.

9. The data output circuit of claim 8, wherein each of the plurality of trimming units includes:
   a first NMOS transistor coupled between the pull-up circuit and the output node to be turned on or turned off in response to one of the pull-up code signals; and
   a second NMOS transistor coupled between the output node and the pull-down circuit to be turned on or turned off in response to one of the pull-down code signals.

10. A data output circuit comprising:
    a voltage generation circuit configured to generate an operating voltage having a level higher than that of a power supply voltage;
    a pre-driver circuit configured to generate pull-up code signals and pull-down code signals according to the operating voltage, wherein the pull-up code signals and the pull-down code signals are generated to have a level of a ground voltage or a level of the operating voltage; and
    a main driver circuit configured to generate output data corresponding to the level of the power supply voltage or the level of the ground voltage according to internal data, wherein a driving strength of the main driver circuit is adjusted according to the pull-up code signals and the pull-down code signals.

11. The data output circuit of claim 10, wherein the voltage generation circuit includes:
    a charge pump configured to generate a high voltage by performing a pumping operation in response to the power supply voltage, a clock signal, and an enable control signal;
    a replica circuit configured to generate a replica voltage having a potential level substantially the same as the level of the power supply voltage of the output data output from the main driver circuit; and
    a regulator configured to generate the enable control signal for controlling the pumping operation of the charge pump in response to the replica voltage and a reference voltage, and output the operating voltage by adjusting a potential level of a high voltage.

12. The data output circuit of claim 10, wherein the main driver circuit includes a pull-up circuit, a trimming circuit, and a pull-down circuit, which are coupled in series between a first terminal to which the power supply voltage is applied and a second terminal to which the ground voltage is applied.

13. The data output circuit of claim 12, wherein the trimming circuit includes a plurality of trimming units commonly coupled to an output node,
    wherein each of the plurality of trimming units is activated or inactivated in response to one of the pull-up or pull-down code signals.

14. The data output circuit of claim 13, wherein each of the plurality of trimming units includes:
    a first NMOS transistor coupled between the pull-up circuit and the output node to be turned on or turned off in response to one of the pull-up code signals; and a second NMOS transistor coupled between the output node and the pull-down circuit to be turned on or turned off in response to one of the pull-down code signals.

15. The data output circuit of claim 12, wherein the pull-up circuit includes a PMOS transistor coupled between the first terminal and the trimming circuit, the PMOS transistor being turned on or turned off in response to the internal data.

16. The data output circuit of claim 12, wherein the pull-down circuit includes an NMOS transistor coupled between the trimming circuit and the second terminal, the NMOS transistor being turned on or turned off in response to the internal data.

17. A data output circuit comprising:
a voltage generation circuit operably coupled to a first power supply voltage and configured to generate an operating voltage having a level higher than a level of the first power supply voltage;
a calibration code generation circuit configured to generate calibration code signals based on a temperature change and a fixed power supply voltage;
a pre-driver circuit configured to receive the operating voltage and generate pull-up code signals and pull-down code signals based on the calibration code signals;
a data pre-driver circuit operably coupled to the first power supply voltage and configured to receive and invert input data and output the inverted input data as internal data; and
a main driver circuit operably coupled to a second power supply voltage less than the operating voltage and configured to receive the internal data and generate output data, wherein a level of the output data is adjusted according to the pull-up code signals or the pull-down code signals.

* * * * *